(12) United States Patent
Banna et al.

(10) Patent No.: US 8,017,998 B1
(45) Date of Patent: Sep. 13, 2011

(54) GETTERING CONTAMINANTS FOR INTEGRATED CIRCUITS FORMED ON A SILICON-ON-INSULATOR STRUCTURE

(75) Inventors: Srinivasa R. Banna, San Jose, CA (US); Scott Robins, San Jose, CA (US)

(73) Assignee: T-RAM Semiconductor, Inc., Mountain View, CA (US)

( * ) Notice: Subject to any disclaimer, the term of this patent is extended or adjusted under 35 U.S.C. 154(b) by 122 days.

(21) Appl. No.: 12/555,665

(22) Filed: Sep. 8, 2009

(51) Int. Cl.
*H01L 21/84* (2006.01)

(52) U.S. Cl. .................. 257/347; 438/470; 257/E21.561

(58) Field of Classification Search .......... 438/470–474; 257/347–354, E21.561
See application file for complete search history.

(56) References Cited

U.S. PATENT DOCUMENTS

| | | | |
|---|---|---|---|
| 5,244,819 A * | 9/1993 | Yue | 438/402 |
| 5,753,560 A * | 5/1998 | Hong et al. | 438/402 |
| 6,229,161 B1 | 5/2001 | Nemati | |
| 6,462,359 B1 | 10/2002 | Nemati | |
| 6,583,452 B1 | 6/2003 | Cho | |
| 6,666,481 B1 | 12/2003 | Horch | |
| 6,683,330 B1 | 1/2004 | Horch | |
| 6,686,612 B1 | 2/2004 | Horch | |
| 6,690,039 B1 | 2/2004 | Nemati | |
| 6,703,646 B1 | 3/2004 | Nemati | |
| 6,727,528 B1 | 4/2004 | Robins | |
| 6,756,612 B1 | 6/2004 | Nemati | |
| 6,767,770 B1 | 7/2004 | Horch | |
| 6,790,713 B1 | 9/2004 | Horch | |
| 6,815,734 B1 | 11/2004 | Horch | |
| 6,818,482 B1 | 11/2004 | Horch | |
| 6,835,997 B1 | 12/2004 | Horch | |
| 6,888,176 B1 | 5/2005 | Horch | |
| 6,888,177 B1 | 5/2005 | Nemati | |
| 6,913,955 B1 | 7/2005 | Horch | |
| 6,953,953 B1 | 10/2005 | Horch | |
| 6,965,129 B1 | 11/2005 | Horch | |
| 6,980,457 B1 | 12/2005 | Horch | |
| 6,998,298 B1 | 2/2006 | Horch | |
| 6,998,652 B1 | 2/2006 | Horch | |
| 7,037,763 B1 | 5/2006 | Nemati | |
| 7,075,122 B1 | 7/2006 | Yang | |
| 7,078,739 B1 | 7/2006 | Nemati | |
| 7,109,532 B1 | 9/2006 | Lee | |
| 7,135,745 B1 | 11/2006 | Horch | |

(Continued)

OTHER PUBLICATIONS

S.Q.Hong et al., "Improvement in gate oxide integrity on thin-film silicon-on-insulator substrates by lateral gettering," Appl. Phys. Lett., vol. 71(23), p. 8 Dec. 1997.

(Continued)

*Primary Examiner* — Richard A. Booth

(74) *Attorney, Agent, or Firm* — The Webostad Firm

(57) ABSTRACT

Gettering contaminants for formation of integrated circuits on a semiconductor-on-insulator structure is described. A semiconductor-on-insulator structure is configured to attract contaminants. Contaminant attractor regions are formed using ion implantation into a semiconductor layer of the semiconductor-on-insulator structure. The semiconductor layer is located above a buried insulator layer of the semiconductor-on-insulator structure. The contaminant attractor regions are spaced away from active regions. Tiles are located on an upper surface of the buried insulator layer. The contaminant attractor regions are formed adjacent to, in close proximity to, or in the tiles. At least one dielectric layer laterally adjacent to the tiles and is disposed on the upper surface of the buried insulator layer. The at least one dielectric layer at least inhibits lateral migration of contaminants to the active regions.

10 Claims, 11 Drawing Sheets

| U.S. PATENT DOCUMENTS | | |
|---|---|---|
| 7,157,342 B1 | 1/2007 | Tarabbia |
| 7,195,959 B1 | 3/2007 | Plummer |
| 7,262,443 B1 | 8/2007 | Yang |
| 7,279,367 B1 | 10/2007 | Horch |
| 7,316,941 B1 | 1/2008 | Gupta |
| 7,326,969 B1 | 2/2008 | Horch |
| 7,381,999 B1 | 6/2008 | Yang |
| 7,456,439 B1 | 11/2008 | Horch |
| 7,491,586 B2 | 2/2009 | Horch |
| 7,554,130 B1 | 6/2009 | Robins |
| 7,573,077 B1 | 8/2009 | Ershov |
| 7,592,642 B1 | 9/2009 | Banna |
| 2005/0233506 A1 | 10/2005 | Horch |

OTHER PUBLICATIONS

S. Kishino et al., "Proposal of Novel Gettering Technique for Thin SOI Wafer," Electrochemical and Solid-State Letters, vol. 7(9), pp. G192-G194, 2004.

C. Pearce, J. Moore, & F. Stevie [AT&T Bell Labs], "Removal of Alkaline Impurities in a Polysilicon Gate Structure by Phosphorus Diffusion", J. Electrochem. Soc., vol. 140, p. 1409 (1993).

M. Schlacter, E. Schlegel, R. Keen, R. Lathlaen, & G. Schnable [Ford Microelectronics], "Advantages of Vapor-Plated Phosphosilicate Films in Large-Scale Integrated Circuit Arrays," IEEE Trans El Dev ED, vol. 17, p. 1077 (1970).

* cited by examiner

//patent US 8,017,998 B1

GETTERING CONTAMINANTS FOR INTEGRATED CIRCUITS FORMED ON A SILICON-ON-INSULATOR STRUCTURE

FIELD

One or more aspects of the invention generally relate to integrated circuits and, more particularly, to gettering contaminants for formation of integrated circuits on a semiconductor-on-insulator structure, for example a silicon-on-insulator structure.

BACKGROUND

Conventionally, semiconductor memories, such as static random access memory ("SRAM") and dynamic random access memory ("DRAM"), are in widespread use. DRAM is very common due to its high density with a cell size typically between $6F^2$ and $8F^2$, where F is a minimum feature size. However, DRAM conventionally has relatively slow access time. SRAM access time is conventionally an order of magnitude faster than DRAM. Though, an SRAM cell is commonly made of four transistors and two resistors or of six transistors, thus leading to a density of approximately $60F^2$ to $100F^2$.

Memory designs based on a negative differential resistance ("NDR") cell, such as a thyristor cell, have been introduced as a replacement for conventional DRAM and SRAM. A thyristor-based random access memory ("RAM") may be effective in either or both SRAM and DRAM applications.

Contaminants remain a problem in forming integrated circuits. This problem is exacerbated in silicon-on-insulator ("SOI") wafers, as some contaminants do not diffuse through the buried oxide layer, and thus remain in the silicon layer used for formation of integrated circuit components.

Accordingly, it would be desirable and useful to provide means to mitigate against harmful effects of contaminants.

BRIEF SUMMARY

One or more aspects of the invention generally relate to integrated circuits and, more particularly, to gettering contaminants for formation of integrated circuits on a semiconductor-on-insulator structure.

An aspect is a semiconductor-on-insulator structure configured to attract contaminants. Contaminant attractor regions are formed using ion implantation into a semiconductor layer of the semiconductor-on-insulator structure. The semiconductor layer is located above a buried insulator layer of the semiconductor-on-insulator structure. The contaminant attractor regions are spaced away from active regions of the semiconductor-on-insulator structure. Tiles are located on an upper surface of the buried insulator layer. The contaminant attractor regions are formed adjacent to, in close proximity to, or in the tiles. The contaminant attractor regions are for gettering at least a portion of the contaminants located in the active regions to the contaminant attractor regions. At least one dielectric layer laterally adjacent to the tiles and is disposed on the upper surface of the buried insulator layer. The at least one dielectric layer at least inhibits lateral migration of contaminants to the active regions.

Another aspect is a method for forming an array of thyristor-based memory cells. A semiconductor-on-insulator structure is obtained. Shallow trench isolation regions are formed in a semiconductor layer of the semiconductor-on-insulator structure. A patterned mask defining openings is formed, and the openings are associated with at least one type of contact of the thyristor-based memory cells. An implanting is done into contact regions associated with the openings, the implanting forming defect regions within the contact regions. A thermal cycling of the semiconductor-on-insulator structure is done to getter contaminants toward the defect regions.

Yet another aspect is an integrated circuit formed on a semiconductor-on-insulator structure configured to attract contaminants. Contaminant attractor regions are formed using ion implantation into a semiconductor layer of the semiconductor-on-insulator structure. The semiconductor layer is located above a buried oxide layer of the semiconductor-on-insulator structure. An active region of the semiconductor layer of the semiconductor-on-insulator structure includes a dummy stripe and an active stripe. The dummy stripe is disposed at or proximate to an outer border of the active region. The ion implantation is into the dummy stripe for formation of the contaminant attractor regions therein. The contaminant attractor regions are for gettering at least a portion of the contaminants in the active region to the first contaminant attractor regions. At least one dielectric layer is disposed on the upper surface of the buried oxide layer including extending laterally along sides of the dummy stripe. The at least one dielectric layer at least inhibits lateral migration of the contaminants from the contaminant attractor regions of the dummy stripe to the active stripe when the semiconductor-on-insulator structure is exposed to a thermal cycle sufficient to mobilize the contaminants.

Still yet another aspect is a method of forming a semiconductor-on-insulator structure configured to attract contaminants away from active regions. Contaminant attractor regions are formed using ion implantation into a semiconductor layer of the semiconductor-on-insulator structure. The semiconductor layer is located above a buried insulator layer of the semiconductor-on-insulator structure. The contaminant attractor regions are spaced away from the active regions of the semiconductor-on-insulator structure. The contaminant attractor regions are formed adjacent to, in close proximity to, or in tiles. The tiles are located on an upper surface of the buried insulator layer of the semiconductor-on-insulator structure. The contaminants are mobilized by bringing the semiconductor layer up to an elevated temperature at least above 250 degrees Celsius. A sufficient duration of time at the elevated temperature is provided for the contaminants to diffuse to the contaminant attractor regions. The contaminants are trapped in the contaminant attractor regions. A patterned mask is formed above the semiconductor layer, and the semiconductor layer is etched to remove at least a portion thereof to expose sidewalls of the tiles. At least one dielectric layer laterally surrounding the tiles is formed such that it is disposed on the upper surface of the buried insulator layer. The at least one dielectric layer at least inhibits lateral migration of the contaminants trapped in the tiles to the active regions.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIGS. 4-1 through 4-3, is a flow diagram depicting an exemplary embodiment of a process flow for forming an array of thyristor-based memory cells.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items, however, in alternative embodiments the items may be different.

Figure 1A:
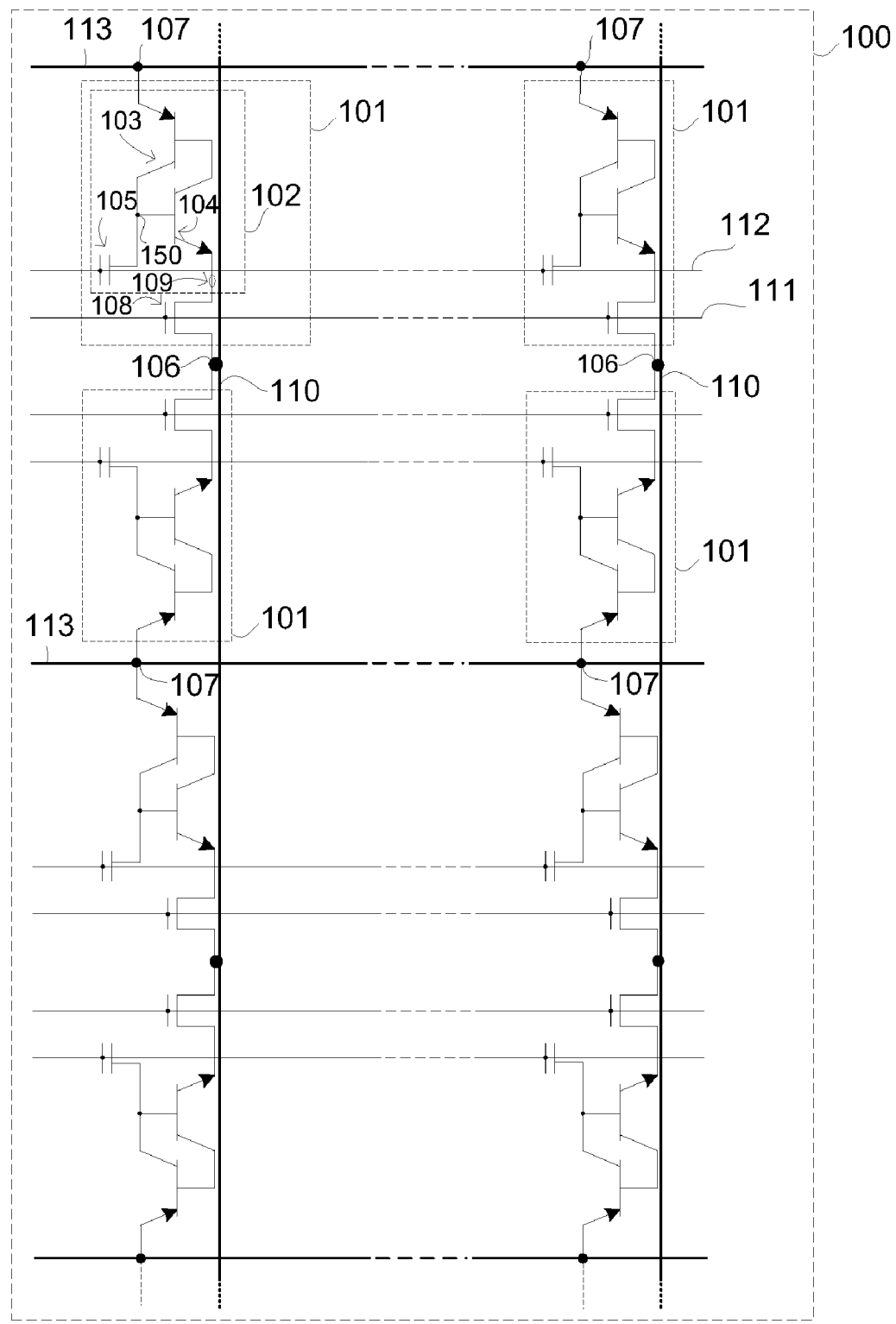
FIG. 1A is a schematic diagram depicting an exemplary embodiment of a memory array that includes thyristor-based memory cells.

FIG. 1A is a schematic diagram depicting an exemplary embodiment of a memory array 100. Memory array 100 includes thyristor-based memory devices 101. Pairs of memory devices 101 may be commonly coupled at a bitline contact 106 for connection to a bitline 110 and may be commonly coupled at a supply voltage contact 107 for connection to a supply voltage line 113. Voltage on supply voltage line 113 is above both a logic low voltage reference level ("Vss") and a logic high voltage reference level ("Vdd"), and this supply voltage may be used as an anodic voltage for memory device 101. Accordingly, reference to this supply voltage includes its anodic use, and as such it is referred to herein as "VDDA" to clearly distinguish it from Vdd. Thus, supply voltage line 113 is subsequently referred to herein as anode voltage line 113, and supply voltage contact 107 is subsequent referred to herein as anode contact 107.

Each memory device 101 includes an access device ("transistor") 108, which may be a field effect transistor ("FET"), and a thyristor-based storage element 102. In this embodiment, memory device 101 is for SRAM or SRAM-like applications. However, access device 108 may be removed for forming a memory device 101 with an array of thyristor-based storage elements ("array of memory cells") 200, as described below in additional detail with reference to FIG. 1C.

Access device 108 need not be a transistor; however, for purposes of clarity by way of example, access device 108 shall be referred to herein as transistor 108. Storage element 102 and transistor 108 may be commonly coupled at a node 109. Node 109 may be a cathodic node of storage element 102 and a source/drain node of transistor 108, and thus may be referred to hereafter as cathode node 109.

In an alternatively embodiment, anode and cathode may be reversed, namely anode node 109 and cathode node 107. This may be thought of as a reversed voltage level difference embodiment. However, for purposes of clarity by way of example and not limitation, it shall be assumed that node 109 is a cathode node and node 107 is an anode node, even though in other embodiments these nodes may have reverse functions.

In FIG. 1A, an equivalent circuit model of storage element 102 having cross coupled bi-polar junction transistors ("BJTs") 103 and 104, as well as capacitor 105. Storage element 102 may be a type of a device known as Thin Capacity Coupled Thyristor ("TCCT") device. Again, in this example, storage element 102 is coupled in series with an NMOS transistor 108 to provide memory device 101. However, a PMOS architecture may be used, namely a reverse polarity from the one described herein may be used. For purposes of clarity by way of example and not limitation, it shall be assumed than transistor 108 is an NMOS device.

For each memory device 101, a gate of access transistor 108 is formed from a wordline ("WL1") 111 in relation to an active area, as generally indicated in FIG. 1A by small dots coupling gates of access transistors 108 to WL1s 111. A control gate of storage element 102, generally indicated as a plate of capacitor 105, is formed with another wordline ("WL2") 112, as generally indicated by small dots coupling plates of capacitor 105 to WL2s 112. Though only a few rows of memory cells 101 are illustratively shown in FIG. 1A, it should be appreciated that many more rows may be used. The exact number of memory cells or bits associated with a WL1 111 or a WL2 112 may vary from application to application.

An emitter node of BJT 103 is coupled to anode voltage line 113 by anode contact 107. A base of BJT 103 is coupled a collector of BJT 104. An emitter of BJT 104 is coupled to cathode node 109. A base of BJT 104 and a collector of BJT 103 are commonly coupled to a bottom plate of capacitor 105, and this common coupling location may be generally referred to as storage node 150.

Figure 1B:
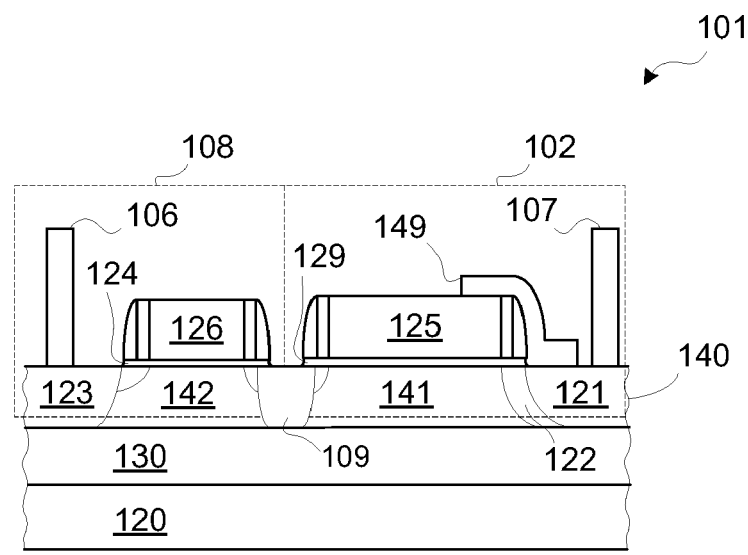
FIG. 1B is a cross-sectional view depicting an exemplary embodiment of a device structure for a memory cell of the memory array of FIG. 1A.

FIG. 1B is a cross-sectional view depicting an exemplary embodiment of a device structure for a memory device 101 of FIG. 1A. In this embodiment, memory device 101 is formed using a silicon-on-insulator ("SOI") structure, such as an SOI wafer, having a substrate layer 120 on which a buried oxide ("BOx") layer 130 is formed. Formed on BOx layer 130 is an active silicon layer 140. Alternatively, an SOI structure may be formed on a bulk silicon wafer.

In active silicon layer 140, access device body region 142, anode region 121, base region 122, base region 141, cathode region 109, and bitline access region 123 are formed. Base region 141 is located between base region 122 and cathode region 109 of storage element 102. Between cathode node 109 and access region 123 is access device body region 142. In this embodiment, regions 121, 141, and 142 are p-type regions, and regions 109, 122, and 123 are n-type regions.

In an alternative embodiment, for SRAM or SRAM-like applications, NMOS transistor 108 is replaced with a PMOS transistor 108, and doping types of regions are swapped, namely n-type for p-type and vice versa, without having to have any structural changes for the embodiment illustratively depicted in FIG. 1B. Thus regions 121, 122, 141, 109, 142, and 123 respectively are cathode, p-base, n-base, anode, n-well, and p-type (e.g., p+) source/drain regions.

Above regions 142 and 141 may respectively be formed one or more dielectric layers 124 and 129. Above one or more dielectric layers 124 and 129 may respectively be formed wordlines 111 and 112 of FIG. 1A, which in association with regions 142 and 141 are defined gates 126 and 125, respectively. One or more dielectric layers 124 and 129 may be the same or different sets of layers, and such gate dielectric as associated with gate 126 and one or more dielectric layers 124 may be thinner than such gate dielectric associated with gate 125 and dielectric layers 129. Gate 126 is a gate of transistor 108 and an access gate of memory device 101, and gate 125 is a control gate of storage element 102 and a write gate of memory device 101. An anode contact 107 is coupled to anode region 121, and a bitline contact 106 is coupled to access region 123. Access region 123 and cathode node 109 also serve as source/drain regions of transistor 108. Other details regarding memory device 101, including silicides, extension regions, and spacers, among other known details, may be found in U.S. Pat. Nos. 6,767,770 B1 and 6,690,039 B1.

Figure 1C:
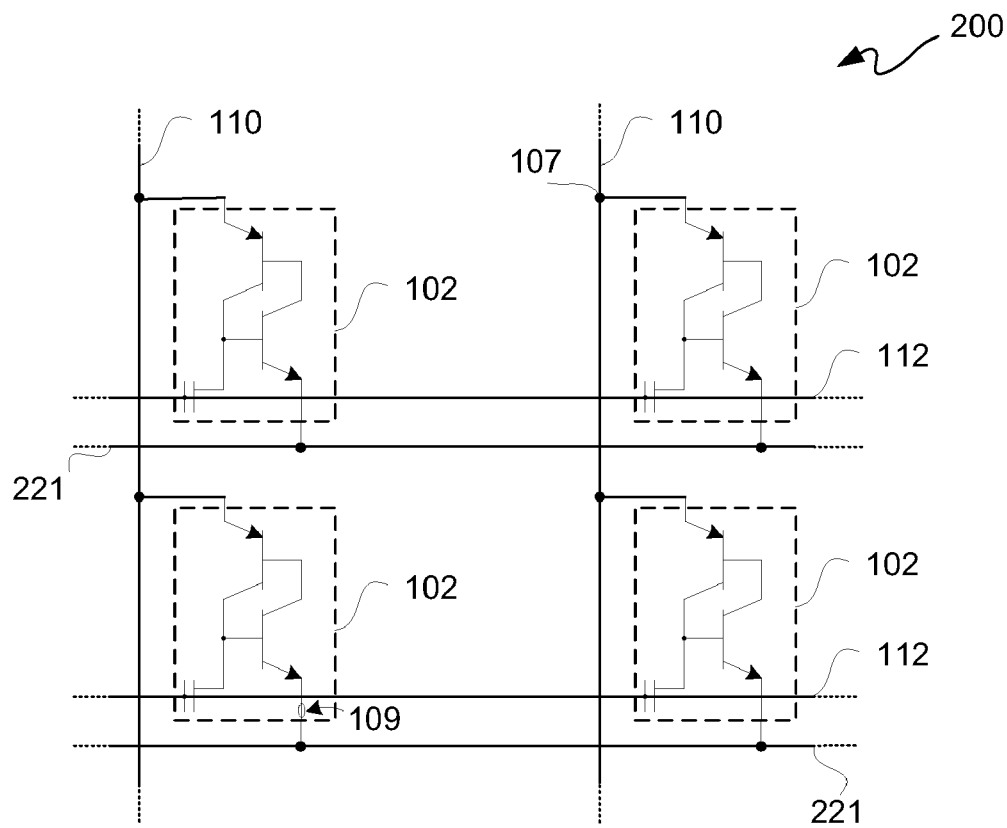
FIG. 1C is a circuit diagram depicting an exemplary embodiment of a thyristor-based array of cells for a DRAM or DRAM-like application.

FIG. 1C is a circuit diagram depicting an exemplary embodiment of a thyristor-based array of cells ("array") 200 for a DRAM or DRAM-like application. Array 200 includes TCCT storage elements or thyristor-based memory cells ("memory cells") 102.

WL2s 112 in this exemplary embodiment are wordlines, as previously described. Row lines 221 are commonly coupled to rows of memory cells 102 at respective nodes 109 thereof, which may be cathodes. For purposes of clarity, the term "node," as used herein, is to refer to either or both a contact and a semiconductor region. Bitlines or column lines 110 are commonly coupled to columns of memory cells 102 at nodes 107 thereof, which may be anodes.

In an alternative embodiment, wordline and bitline functions may be swapped to form an "inverse" cell. In such an "inverse cell," p- and n-type dopings are reversed from the embodiment described herein for purposes of clarity and not limitation. In the inverse cell, anode and cathode positions are swapped from the embodiment described herein for purposes of clarity and not limitation. Thus, in FIG. 1B, access device 108 would be removed for the embodiment of FIG. 1C, and in an inverse cell embodiment for the embodiment of FIG. 1C, base region 122 would be next to a cathode, namely a cathode region 121, and would be a p-base. However, for purposes of clarity by way of example and not limitation, it shall be assumed that base region 122 is next to an anode region 121 and is an n-base. In other words, for purposes of clarity by way of example and not limitation, it shall be assumed that node 109 is a cathode and node 107 is an anode, even though in other embodiments these nodes may have reverse functions.

Such an array of memory cells 200 may be used in DRAM or DRAM-like applications, where access devices are generally for multiple memory cells, such as a row or column of memory cells, of the array. However, for purposes of clarity by way of example and not limitation, it shall be assumed that a memory device includes an access device 108 even though in other embodiments such a memory device may not include an access device 108.

Figure 2A:
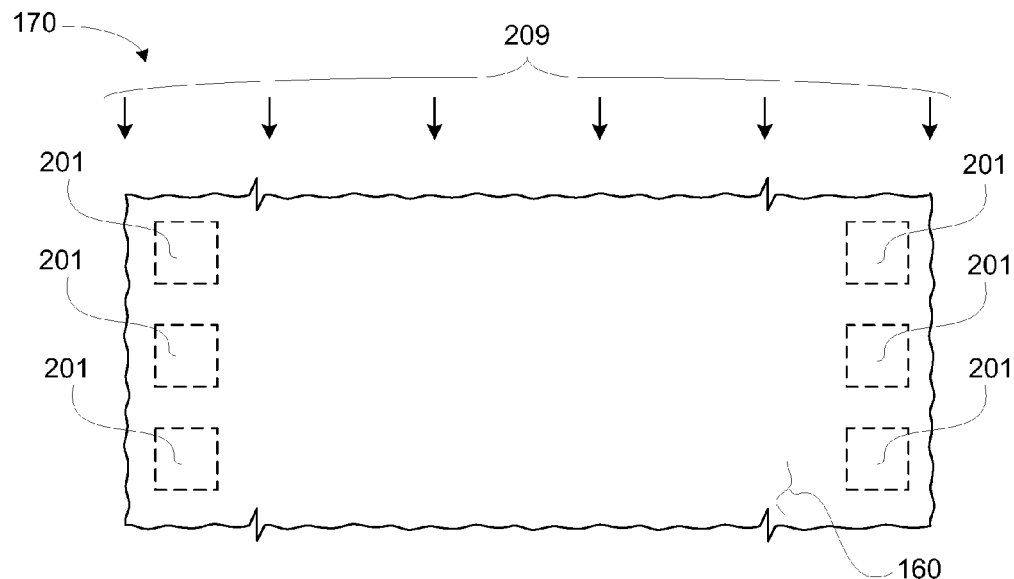
FIG. 2A is a top elevation view depicting a portion of a silicon-on-insulator ("SOI") wafer ("SOI portion").

FIG. 2A is a top elevation view depicting a portion of a SOI wafer ("SOI portion") 170. Even though the example of an SOI wafer is used, it should be appreciated that other types of semiconductors, other than silicon, and other types of dielectrics, other than oxide, may be used provided contaminants may be mobilized in such other types of semiconductors and generally do not diffuse in such other types of dielectrics. Furthermore, while an entire SOI wafer may be used in the formation of semiconductor integrated circuit die as described herein, only a portion of such wafer is described herein for purposes of clarity and not limitation. SOI portion 170 may be used for forming an array of thyristor-based memory cells, whether as a stand-alone integrated circuit or as an embedded array in a host integrated circuit. While an exemplary embodiment of an array of thyristor-based memory cells is used, it should be understood that the scope of application for the description herein is for any SOI integrated circuit having leakage and/or yield sensitivity issues due to "contaminants." For purposes of clarity and unless otherwise contextually or expressly indicated otherwise, the term "contaminants" as used herein singly and collectively refers to contaminants and/or crystalline defects. SOI portion 170 has a top surface on which a mask 160 is formed. Mask 160 may be formed using known lithography technology to define regions for dummy structures, described below in additional detail.

Tiles may be formed to facilitate planar polishing when using a type of technology known as chemical-mechanical polishing ("CMP"). CMP of a semiconductor wafer may be purely a chemical, purely a mechanical, or a combination of a chemical and a mechanical polishing. Such polishing generally substantially planarizes a wafer surface, subject to tile deflection. To mitigate against what is known as "CMP dishing," dummy structures ("tiles") are formed using SOI portion 170.

Implant 209 is used to create damage regions in what will be defined as tiles 201 as indicated by dashed lines, as described below in additional detail. Examples of the type of defects of damage regions include point/crystalline defects, and an agglomeration of one or more of these types of defects. Such defect sites facilitate trapping of contaminants. By silicon point defects, it is generally meant vacancies and interstitials in lattice structure of silicon crystalline. Such point defects may adversely affect device characteristics.

Point defects may be mid-gap states and may increase junction leakage in a manner which is generally electrically equivalent to junction leakage increased due to metallic contamination. It should be understood that defects created by a damage implant include silicon point defects. Furthermore, it should be understood that damage regions may getter silicon point defects, including silicon point defects previously located in the device active regions. While not wishing to be bound by theory, it is believed that the reason implant damaged regions replete with point defects can getter other point defects with a high temp anneal is that the implant-created point defects will first quickly agglomerate into larger line defects, which are more stable and much less able to diffuse away. These line defects continue to agglomerate by acting as a diffusive sinks for other point defects from adjacent active device regions.

In order for the damage regions to sink point defects, however, relatively high diffusion temperatures may be used, such as in the range of approximately 800 to 1100° C., to first form defect clusters and then allow diffusion of point defects to the defect clusters. The exact temperature used depends on the proximity of a damaged region to a point defect site and the time allowed for defect diffusion. Diffusion length is generally proportional to the square root of a "diffusion constant," D, multiplied by time allowed for such diffusion. The diffusion constant, D, is a function of temperature.

While damage regions may be used to getter mobile contaminants (e.g., metallic contaminants) with some thermal energy, if such damage regions receive enough thermal energy to form defect clusters, then such damage regions may act as sinks for silicon point defects. Accordingly, damage regions may be used to getter mobile contaminants and silicon point defects.

Implant 209 may be a heavy ion implant. Examples of ions that may be used to create defect sites include silicon, germanium, carbon, and xenon, among other types of ions that may be used to create damage regions in tiles 201. It should be appreciated that tiles 201 are implanted in this embodiment with implant 209 prior to formation of any active regions of one or more integrated circuits formed using SOI portion 170 and prior to etching a silicon layer to define tiles 201.

Figure 2B:
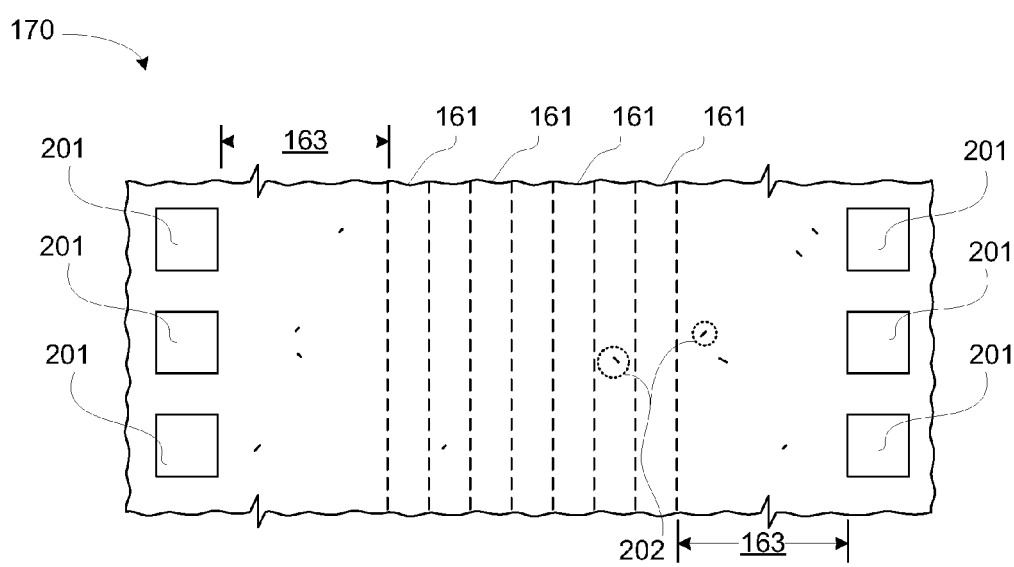
FIG. 2B is the top elevation view of FIG. 2A, where active regions have been defined in the SOI portion of FIG. 2A.

Referring to FIG. 2B, there is shown the top elevation view of FIG. 2A, indicating with dashed lines where active regions ("active stripes") 161 are to be formed by etching responsive to a patterned masking layer (not shown). Accordingly, it should be appreciated that tiles 201 are separated from active regions 161, as generally indicated by expanses 163. Contaminants 202 may already exist in a silicon layer, such as silicon layer 140 of FIG. 1B, of an SOI portion 170, or may result from subsequent handling or semiconductor processing of SOI portion 170. Thus, prior to etching, such as shallow-trench isolation ("STI") etching, of SOI portion 170 to define stripes 161, and possibly tiles 201 at the same time, in order to mitigate any negative effects from such contaminants, contaminants 202 may be gettered, namely attracted to gettering regions formed in SOI portion 170, as described in additional detail with reference to FIG. 2C below.

Figure 6:
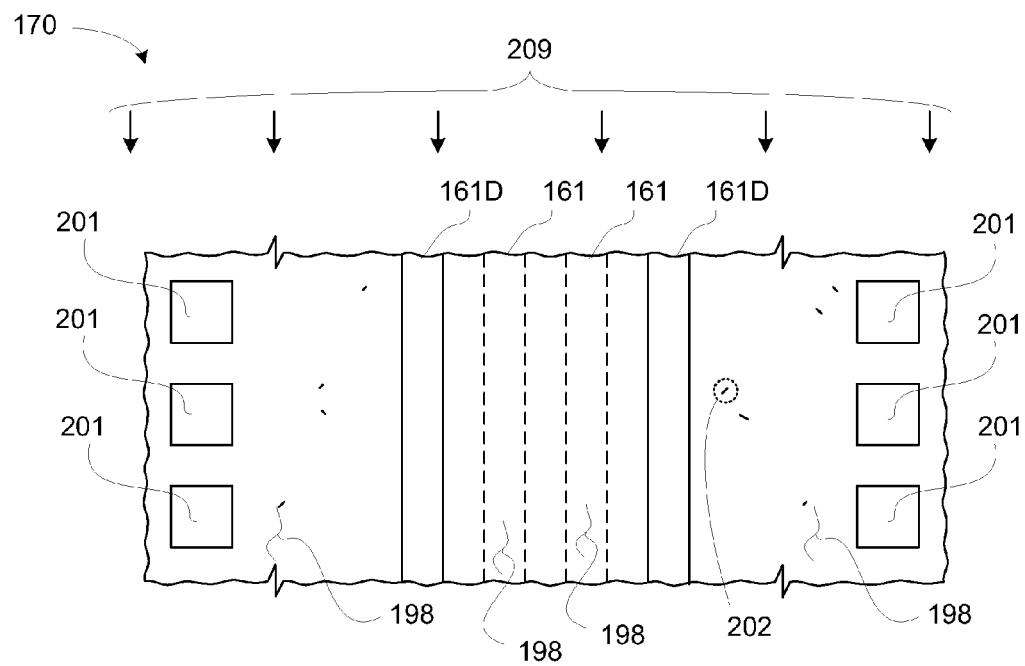
FIG. 6 is a top elevation view depicting a portion of the SOI portion of FIG. 2A with locations for active stripes masked off prior to a damage implant.

In FIG. 6, there is shown a top elevation of an SOI portion 170 for implantation 209 of FIG. 2A. FIG. 6 depicts an alternative embodiment to the embodiment illustratively shown in FIG. 2A. In this embodiment, locations for tiles 201 and dummy stripes 161D are implanted at the same time by damage implant 209. A patterned masking layer 198 having openings for tiles 201 and dummy stripes 161D may be used to for implant 209. Thus, it should be understood that masking layer 198 covers active stripes 161 for protection from implant 209, and exposes dummy stripes 161D and tiles 201 for implantation via implant 209. Optionally regions between stripes 161D and 161, as well as regions between stripes 161, may be uncovered by masking layer 198, namely exposed to implantation via implant 209. Outer located stripes 161D of an array of stripes 161 are used as dummy stripes. Formation of such dummy stripes 161D may be either or both dummy rows or columns even though only one orientation is illustratively depicted for purposes of clarity. Dummy stripes 161D may be added, such as at the outer edges of an array of memory cells or memory devices, to promote uniformity of array patterning, to provide a fixed electrical boundary for memory cells or devices at the outer regions of an array, and to provide an additional location for attracting contaminants; the last of these is described below in additional. Again, contaminants is as defined above.

Mask 198 may be any masking material sufficient to protect active stripes 161 thereunder from damage by implant 209. However, locations for dummy stripes 161D and tiles 201 are exposed to damage implant 209, and thus damage implant 209 creates damage regions in dummy stripes 161D and tiles 201 at the same time. Contaminants 202 are illustratively shown for purposes of clarity; however, it should be understood that such contaminants 202 are covered by mask 198. Again, contaminants is as defined above. Subsequently, in this embodiment, tiles 201 and stripes 161 and 161D may be formed at the same time with a masking layer, other than masking layer 198, and an STI etch.

Figure 2C:
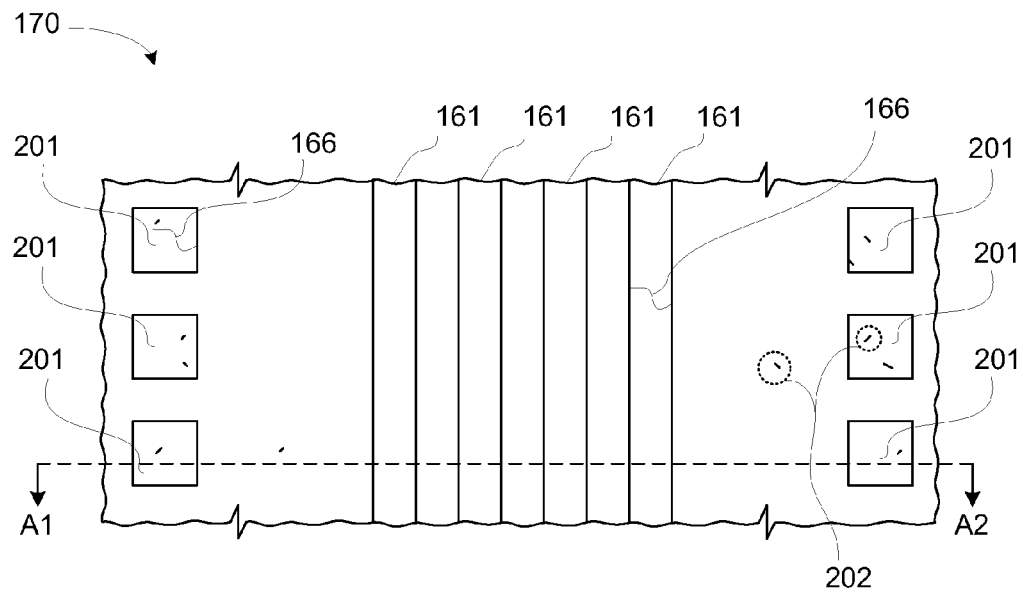
FIG. 2C is the top elevation view of FIG. 2B after gettering of contaminants away from the defined active regions of FIG. 2B.

FIG. 2C is the top elevation view of FIG. 2B after gettering of contaminants 202 and depositing and patterning a mask 166. Again, contaminants is as defined above. Mask 166 is for covering tiles 201, and stripes 161 and 161D for subsequent etching to provide a profile as illustratively depicted in FIG. 2D after removal of mask 166. Some contaminants 202 are gettered to tiles 201, while other contaminants 202, though not reaching tiles 201, are drawn away from locations for active stripes 161. Some contaminants 202 may be drawn or trapped in dummy stripes 161D of FIG. 6; however, for purposes of clarity and not limitation, the embodiment of FIG. 2C is further described without reference to one or more dummy stripes. However, it should be understood that the following description is applicable to embodiments with or without one or more dummy stripes 161D.

Referring back to FIG. 2A, an implant 209 is used to create damage regions in tiles 201. While not wishing to be bound by theory, it is believed that contaminants, as well as defects as described above, are trapped by defects created with implant 209. As gettering of point defects was described above, the following description is for trapping of contaminants; however, it should be understood that gettering of point defects may occur along with trapping of contaminants. Trapping of contaminants causes a localized depletion of contaminants, which is believed to drive a contaminant diffusion process toward defects. Such a contaminant diffusion process may continually trap incoming mobile contaminants in or by such defects. Generally, contaminants are mobile at elevated temperatures. The rate of diffusion of contaminants may generally be said to depend on the type of contaminants and exponentially depend on temperature.

Those contaminants 202 not reaching tiles 201 may be drawn far enough away from locations for active stripes 161 so as to be removed when silicon layer 140 of FIG. 1B is etched, as described below in additional detail. A mask, such as mask 166, may be used to mask off top surface areas of tiles 201 and stripes 161/161D for subsequent etching.

It should be appreciated that in an SOI wafer, some contaminants do not diffuse through or diffuse so slowly through the BOx layer, such as BOx layer 130 of FIG. 1B for example, so as to be effectively confined to silicon layer 140. Gettering such contaminants away from active regions, such as active stripes 161, may improve yield.

Figure 2D:
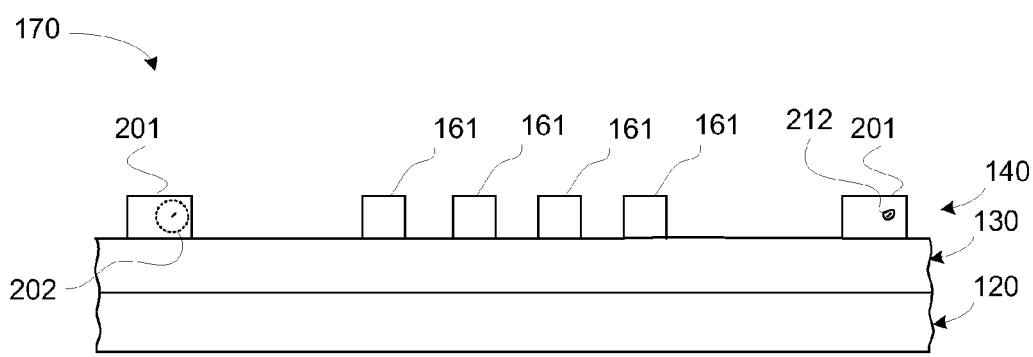
FIG. 2D is a cross-section of the SOI portion of FIGS. 2A through 2C after shallow-trench isolation ("STI") etching.

FIG. 2D is a cross-section of SOI portion 170 after STI etching of an SOI wafer, including SOI portion 170, responsive to mask 166. The cross-section of FIG. 2D is along line A1-A2 as illustratively shown in FIG. 2C. Tiles 201 are formed of silicon layer 140, and as such may extend from an upper surface of such silicon layer 140 down to an upper surface of BOx layer 130. Contaminants 202 trapped in defect sites, such as defect site 212 for example, of tiles 201 remain with SOI portion 170, while contaminants drawn away from active stripes 161 into etch-exposed regions of silicon layer 140 are removed as part of etching to form trench isolation regions, including STI regions between active stripes 161.

Figure 2E:
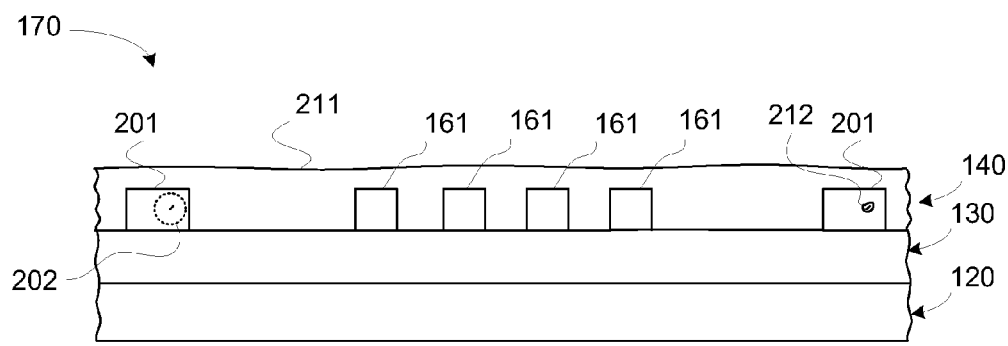
FIG. 2E is the cross-sectional view of FIG. 2D after an STI fill.

Referring to FIG. 2E, there is shown the cross-sectional view of FIG. 2D after an STI fill of an SOI wafer, including SOI portion 170. STI trenches may be filled with one or more dielectric layers. A liner layer may be deposited followed by one or more other dielectric layers for such STI trench filling. However, at least one dielectric layer 211 may be used to laterally electrically isolate active stripes 161 from one another, and may be used to laterally. Formation of at least one dielectric layer 211 further creates a physical barrier to prevent or at least inhibit contaminants 202 in tiles 201 from laterally migrating or diffusing back to active stripes 161. Again, BOx layer 130 prevents such contaminants 202 from diffusing to a substrate or handle layer 120. Thus, at least one dielectric layer 211 may be used to prevent or at least inhibit lateral diffusion of such contaminants 202 from tiles 201 to active stripes 161.

Figure 2F:
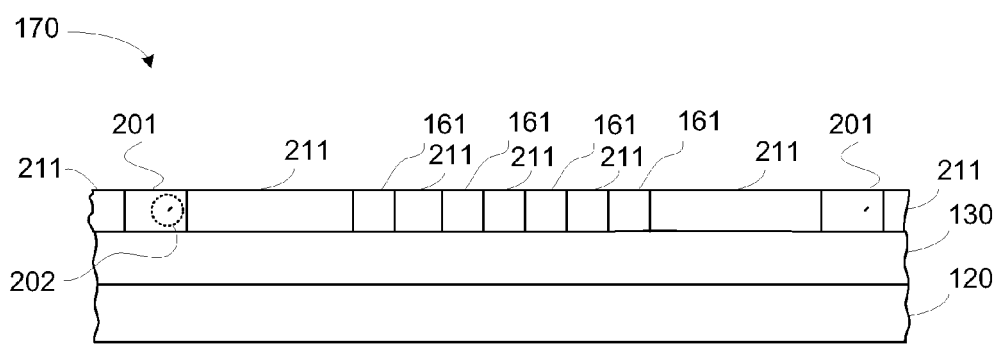
FIG. 2F is the cross-sectional view of FIG. 2E after chemical-mechanical polishing ("CMP").

FIG. 2F is the cross-sectional view of FIG. 2E after CMP of an SOI wafer, including SOI portion 170. Contaminants 202 remain trapped in tiles 201 and are isolated from diffusion to active stripes 161 by dielectric layer 211 and BOx layer 130. Thus, it should be appreciated that by gettering contaminants 202 away from active stripes 161, yield may be enhanced, as contaminants diffuse from active regions and may be trapped in tiles 201.

Figure 3A:
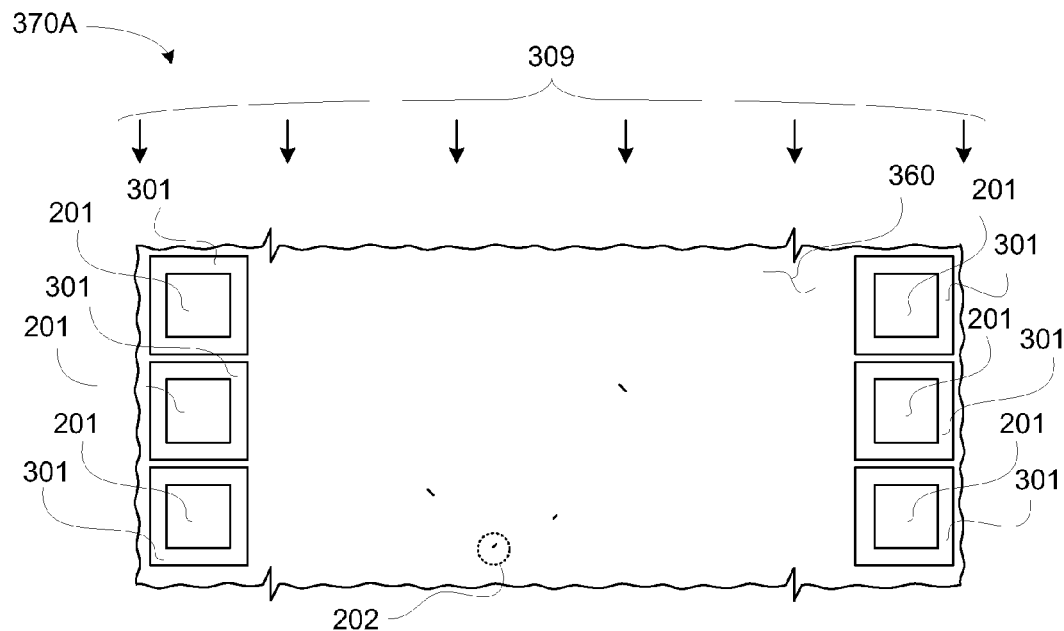
FIG. 3A is a top elevation view depicting an alternative exemplary embodiment of the SOI portion of FIGS. 2A through 2F.

FIG. 3A is a top elevation view depicting an alternative exemplary embodiment of SOI portion 370A. In contrast to FIG. 2A, tile extension regions are formed around the perimeter of each of tiles 201, namely perimeter damage regions 301. In this embodiment, implant 309 may used to create perimeter damage regions 301 around what will later be defined as tiles 201. Mask 360 has openings defining upper surface areas of damage regions 301. Mask 360 in this embodiment covers locations of tiles 201; however, mask 360 may alternatively leave locations of tiles 201 exposed. Thus, contaminants 202 which may be gettered toward tiles 201 may be first trapped in defect sites of perimeter damage regions 301. Implant 309 may use the same heavy ions as described previously with reference to implant 209 of FIG. 2A. Active stripes 161 may be subsequently formed, as described above.

Figure 3B:
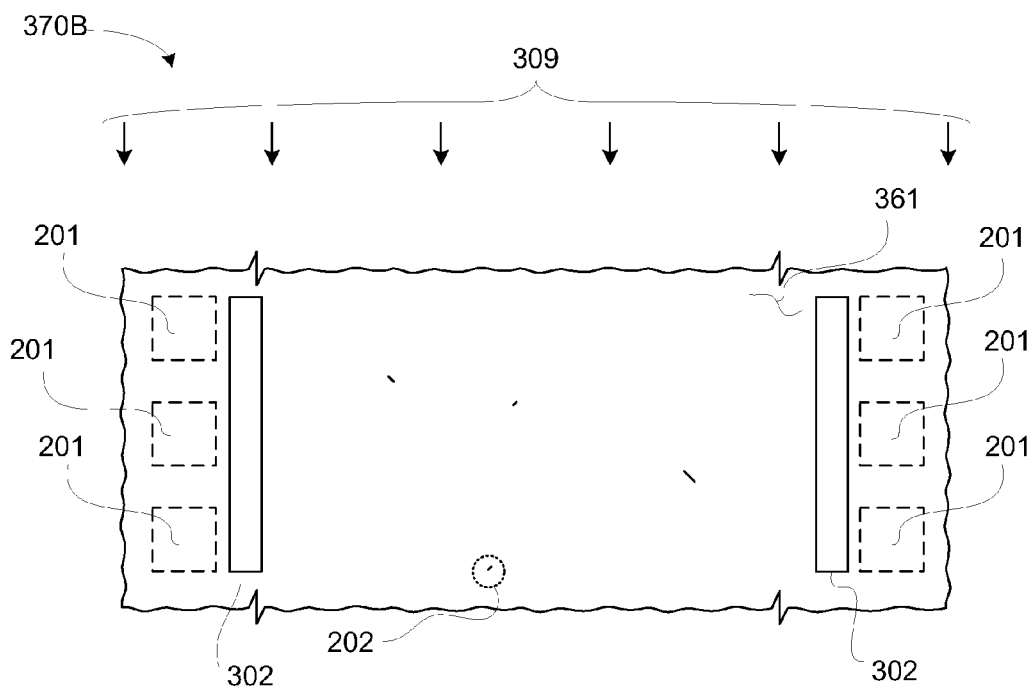
FIG. 3B is a top elevation view depicting yet another exemplary embodiment of the SOI portion of FIGS. 2A through 2F.

FIG. 3B is a top elevation view of yet another exemplary embodiment of SOI portion 370B. In this embodiment, defect sites have been formed in damage regions 302 by a heavy ion implant, such as implant 309. Location of tiles 201 is shown with dashed lines, to reference position of damage regions relative to where tiles 201 will be formed. However, in this embodiment, a patterned masking layer 361 is used to define damage regions 302. Masking layer 361 is to define damage regions 302 between tiles 201 and where active stripes 161 will be formed. Active stripes 161 may be subsequently formed, as described above.

Whether the embodiment of FIG. 3A or 3B, or a combination thereof, is used, it should be appreciated that damage regions 301 and 302 may be removed, as they need not be used to avoid dishing during CMP. Accordingly, after trench etching, SOI portion 170 of FIG. 3A or 3B may result in the cross-section as illustratively shown with reference to FIG. 2D. Damage regions 301 and 302 are removed with STI etching, unlike damage regions 212 of FIG. 2D, for example, which stay put in tiles 201 during and after STI etching. Contaminants 202, which may be trapped in damage regions 301 or 302, may be removed using such STI etching, and thus the likelihood of such contaminants 202 contaminating active regions of SOI portion 170 is substantially reduced, as any contaminants 201 trapped in such regions would be removed and thus would not be available to diffuse out of defect sites in such damage regions 301 and 302. Moreover, with reference to the embodiments of FIGS. 2A, 3A, 3B, 6, or any combination thereof, it should be appreciated that although a single layer of tiles or damage regions is illustratively shown, subsequent tiles or damage regions may be generally stacked upon previously formed tiles or damage regions, or locations associated therewith.

For contaminants to have diffusive mobility, thermal energy is used. This thermal energy may result from one or more semiconductor processing steps to form one or more portions of an integrated circuit, including thyristor-based memory cells, using an SOI wafer. Thermal cycling of sufficient temperature and time for gettering contaminants may result from an additional anneal or subsequent processing, as described below in additional detail.

Figures 1, 4:
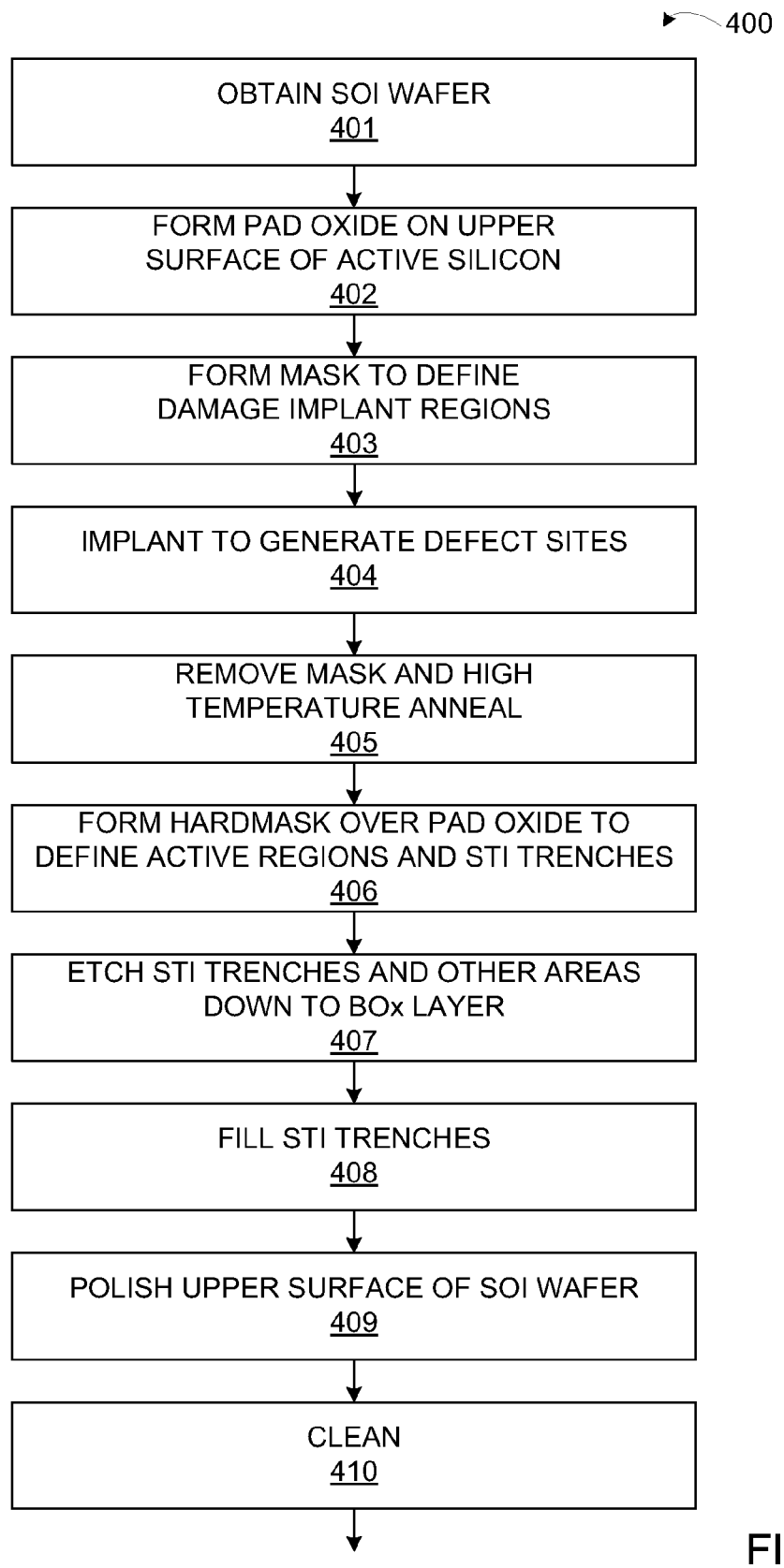
Figures 2, 4:
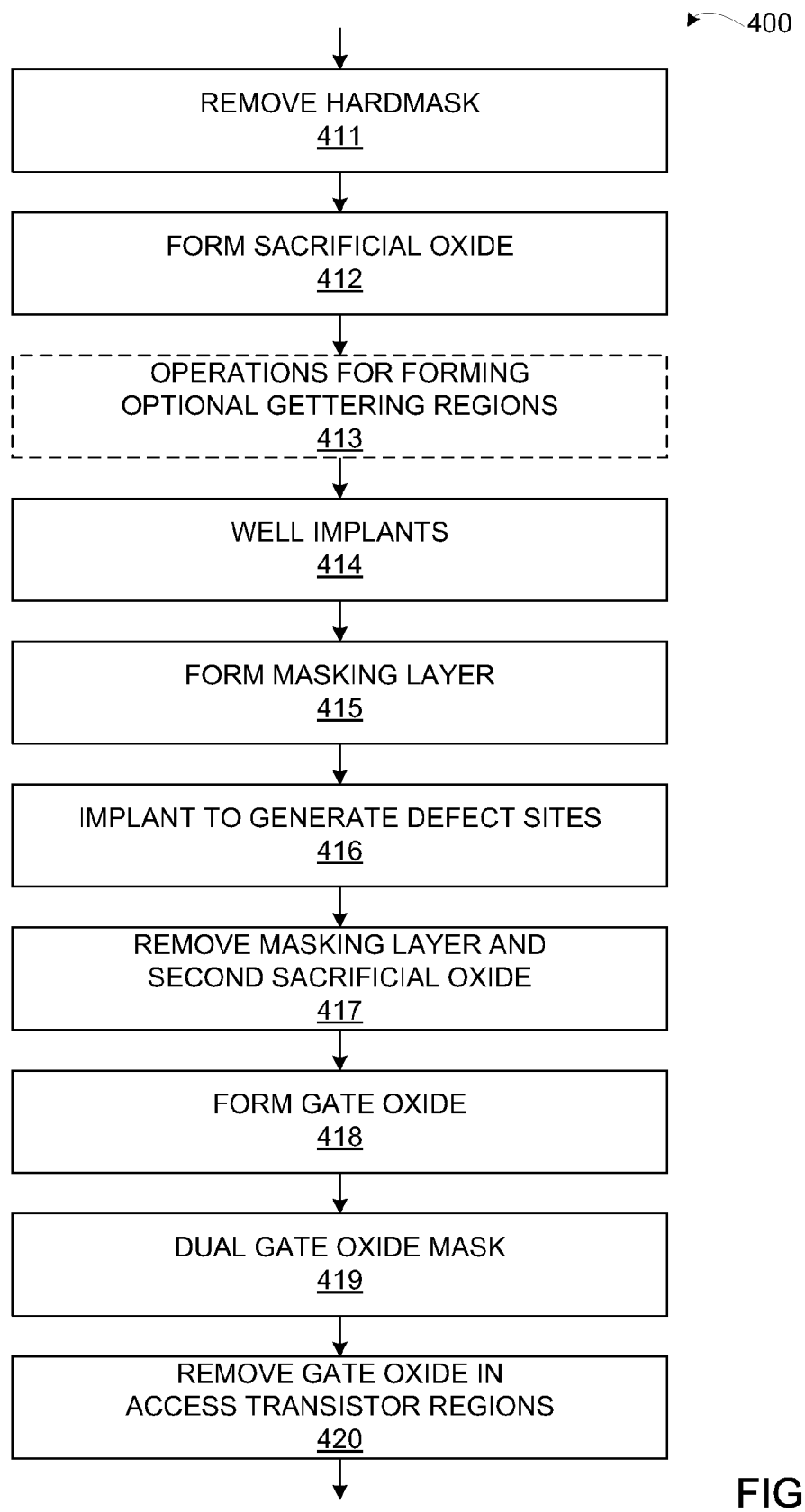
FIG. 4, collectively
Figures 3, 4:
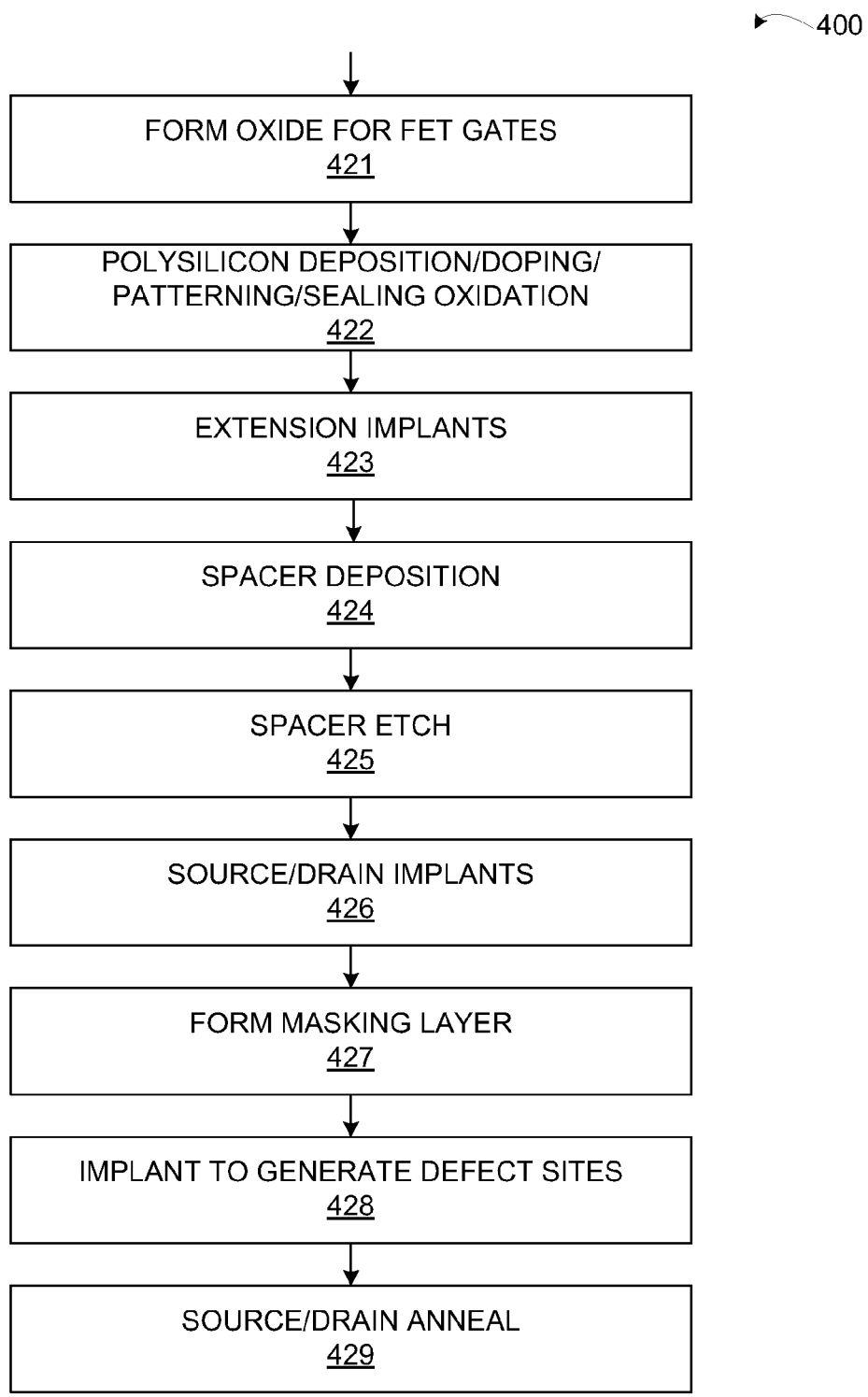
Figure 5:
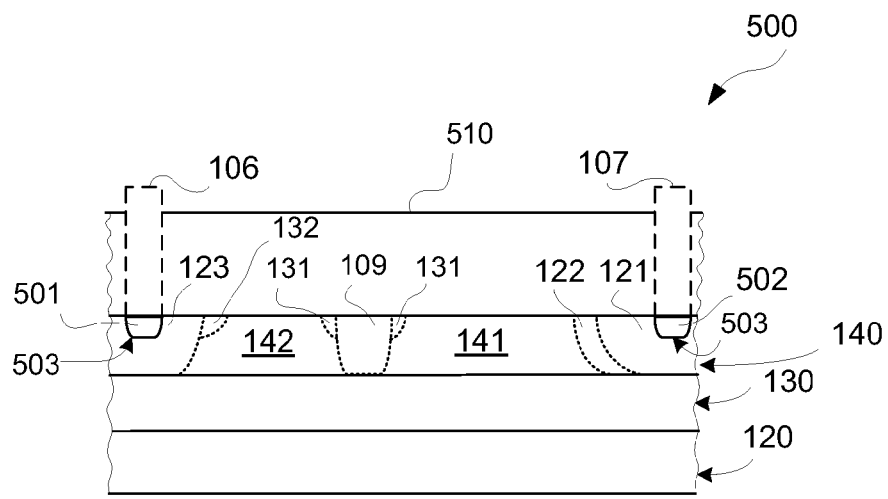
FIG. 5 is the cross-sectional diagram of FIG. 1B for a portion of a thyristor-based memory cell 500 having contaminant gettering regions.

FIG. 4, collectively FIGS. 4-1 through 4-3, is a flow diagram depicting an exemplary embodiment of a process flow for forming an array of thyristor-based memory cells. FIG. 4 is described in part with reference to FIG. 5, where there is shown a cross-sectional diagram depicting an exemplary embodiment of a portion of a thyristor-based memory cell 500 having contaminant gettering regions 501 and 502. In FIG. 5, gate dielectrics, spacers, gate electrodes, and gate contacts are not illustratively indicated for purposes of clarity and not limitation.

Regions formed in silicon layer 140 that are illustratively shown with dotted lines, including extension regions 131 and 132 for example, are to indicate that these regions are not necessarily formed prior to forming contaminant gettering regions 501 and 502. Furthermore, contacts 106 and 107 are shown with dashed lines to indicate the general proximity of contacts 106 and 107 to contaminant gettering regions 501 and 502, respectively, but such contacts 106 and 107 are formed after formation of gettering regions 501 and 502.

In the following description, for purposes of clarity by way of example and not limitation, particular numerical examples are used. However, it shall be appreciated by those of ordinary skill in the art that other numerical examples may be used, as may vary from application to application. Moreover, although the example of a thyristor-based memory cell process flow portion is used, it will be appreciated by those of ordinary skill in the art that any integrated circuit formed using an SOI wafer may be used.

At 401, an SOI wafer is obtained. At 402, a pad oxide is formed on an upper surface of the SOI wafer obtained. This pad oxide may be thermally grown or deposited.

At 403, a mask layer, such as resist mask 160 of FIG. 2A, is formed over the pad oxide to define locations for a damage implant associated with locations for tiles. For purposes of clarity, it shall be assumed that dummy stripes are not used. However, it should be understood from the description herein that dummy stripes may be used with modification to flow 400 in accordance with the above description of FIG. 6.

At 404, a heavy ion implant is used to generate defect sites ("defects") responsive to the mask layer formed at 403. The type of ion that may be used includes xenon, germanium, and carbon ions, among other heavy ions.

At 405, such mask layer formed at 403 is removed, and a high temperature anneal is performed, not necessarily in this order. The anneal is of a sufficiently high temperature to mobilize contaminants. Conventionally, mobility of metal ions, namely metal contaminants, involves temperatures equal to or greater than approximately 450 degrees Celsius. More thorough gettering owing to greater mobility of metal ions may occur due to thermal cycling at approximately 600 degrees Celsius or more, or for longer durations of time, or a combination thereof. Such mobile contaminants generally laterally diffuse and are attracted to defects caused by the implant at 404. Once the temperature of silicon layer 140 is generally sufficiently low, such as below the approximately 250 degrees Celsius value, contaminants, which are no longer mobile, are located in or at least proximate to defects. For example, silicon layer 140 may be allowed to cool to an ambient temperature, such as room temperature.

At 406, a mask layer, such as a hardmask layer, is deposited and patterned over the pad oxide to define active regions and thereby define STI trenches. At 407, STI trenches and other areas are etched down to an upper surface of a BOx layer. Operations at 406 and 407 may involve some thermal cycling; however, even if contaminants are mobilized by these operations, such contaminants generally will remain trapped in or nearby defects and those contaminants not already trapped may become trapped due to such additional mobilization. At 407, tiles, such as tiles 201 and stripes 161 of FIG. 2D, may be formed. At 408, such STI trenches are filled using one or more dielectric layers, which may include a liner layer as well as other types of STI fills.

At 409, the SOI wafer is polished along an upper surface using CMP. The hardmask may be left in place for a stop-on nitride CMP. At 410, top and bottom ("front and back") surfaces of the SOI wafer may be cleaned. At 411, the hardmask formed at 406 may be removed. For a nitride hardmask, a hot phosphoric acid dip may be used to remove the nitride hardmask without removing a significant amount of the pad oxide.

At 412, a sacrificial oxide is formed. This sacrificial oxide may be used to remove dislocations in the active silicon layer caused by stress induced by the nitride hardmask and may be used as a buffer for a well implant.

Figure 7:
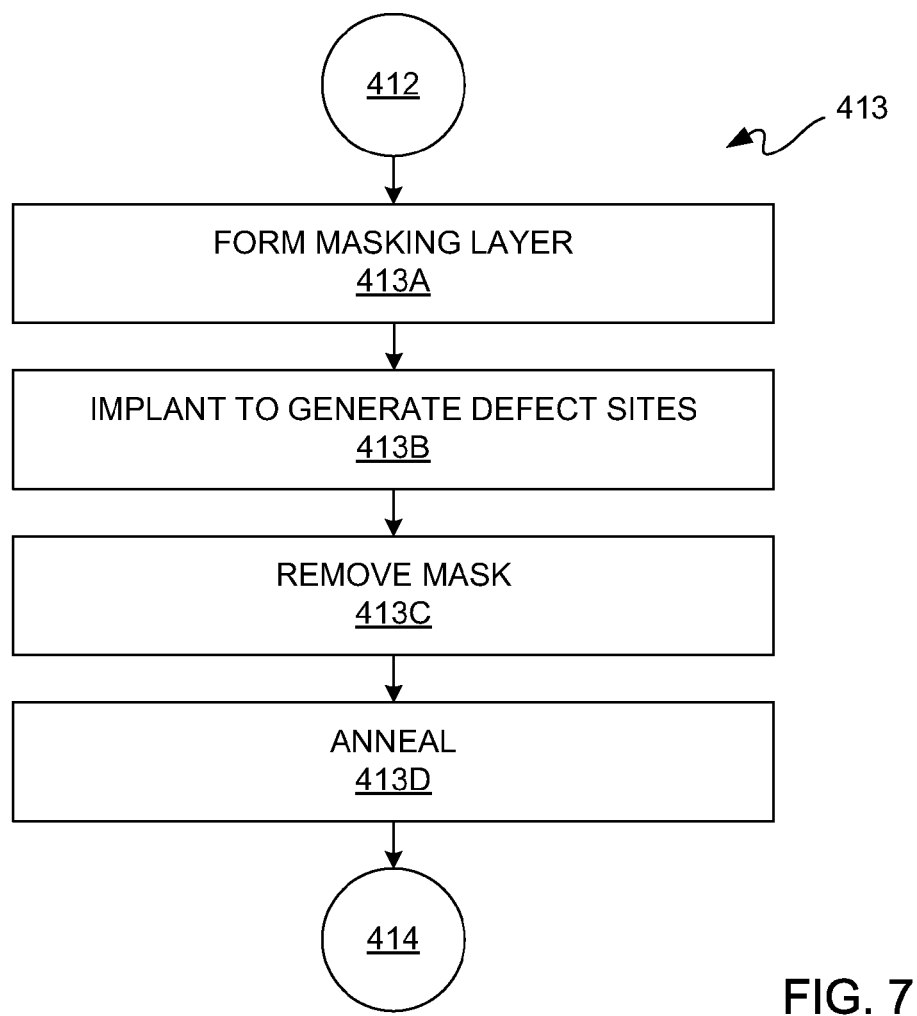
FIG. 7 is a flow diagram depicting an exemplary embodiment of an optional sequence of operations for forming additional gettering regions as part of the flow of FIG. 4.

Optionally, at 413, additional gettering regions may be formed. FIG. 7 is a more detailed flow diagram of operations for forming additional gettering regions at 413.

At 413A, a masking layer may be formed using a contact vias mask. The contact vias for contacts 106 and 107 are proximate to the locations for gettering regions 501 and 502 within an array of thyristor-based memory cells. Thus, masking layer 510 may be formed using the same mask used to form contact vias for contacts 106 and 107 for forming gettering regions 501 and 502. For example, gettering region 502 may be associated with a common anode/cathode contact, and gettering region 501 may be associated with a common bitline/wordline contact. Accordingly, although part of only one memory cell is illustratively shown in FIG. 5, it should be appreciated from the prior description that an entire array of memory cells may be formed.

In an embodiment, every possible contact for an array of thyristor-based memory cells has a gettering region. In another embodiment, not every possible contact for an array of thyristor-based memory cells has a gettering region. Thus, only a portion of the contacts, whether common bitline/wordline contacts or common anode/cathode contacts, or a combination thereof, may be have associated therewith contaminant gettering regions 501 and 502. More particularly, if there were sensitive areas in an array of memory cells, where such memory cells were more sensitive to contaminants than in other regions of an array, contaminant gettering regions 501 or 502 or a combination thereof, may be targeted for formation only in such sensitive areas, and not elsewhere within an array of thyristor-based memory cells. Thus, even though the same contact mask used to form contact vias may be used to define contaminant gettering regions 501 and 502, masking layer 510 may alternatively be formed using a mask that is a variation of the via contact mask, namely a mask that defines a subset of contact vias for forming either or both types of contaminant gettering regions 501 and 502.

Although formation of contaminant gettering regions 501 and 502 responsive to a mask used to form contact vias is described in terms of an array of thyristor-based memory cells, it should be appreciated that contact vias exist in other types of memory arrays, as well as outside of memory arrays. More generally, contact vias exist throughout integrated circuits. Accordingly, gettering regions 501 and 502 are merely examples of gettering regions that may be formed anywhere in an integrated circuit of any type of integrated circuit having contact vias that extend to a contact region in an active silicon layer of an SOI wafer.

At 413B, a heavy ion implant may used to generate defect sites responsive to mask layer 510. Accordingly, contaminant gettering regions 501 and 502 are formed. Ions that may be used for such heavy ion implant include xenon, germanium, or carbon ions, among other heavy ions. The implant energy may be targeted to the middle of active silicon layer 140. It should be appreciated that the single crystalline silicon of silicon layer 140 may be implanted to form defect regions in gettering regions 501 and 502 by the implant at 413B. At 413C, the masking layer formed may be removed.

At 413D, an optional anneal may be performed to enhance gettering of defects and contaminants. However, the heat induced by anneal 413D may be sufficiently high to cause causes mobility of contaminants in an SOI wafer. Accordingly, the defect sites in gettering regions 501 and 502 attract such mobile contaminants and defects, as described above. The thermal cycling may cause defect regions of gettering regions 501 and 502 to trap contaminants and defects gettered to those regions 501 and 502. Boundaries between gettering regions 501 and 502 and their respective contact regions, such as for example bitline access region 123 and anode region 121 respectively, generally prevent reunification of silicon layer 140 into a unitary single crystalline layer. In other words, there may be dislocations along boundaries 503. However, other thermal cycling by other processing subsequent to the damage implant at 413B may have an effect on mobilizing contaminants and some defects. Such other processing, for example, may include a well anneal after well implants at 414, or deposition of a gate dielectric at 418, or a source/drain anneal at 429. Thus, thermal cycling may mobilize contaminants and some defects, while generally allowing at least the more stable defects in gettering regions to remain.

Forming a sacrificial oxide protects channel regions of silicon layer 140 from a subsequent well implant. In other words, a subsequent well implant may cause unwanted damage to the crystalline structure of the silicon layer 140 in proximity to where a gate oxide may be formed. To avoid or minimize this damage, the optional enhanced sacrificial oxide formed at 413D may be used. For purposes of clarity by way of example and not limitation, it shall be assumed that optional operation 413 is employed, even though such optional operation may be omitted in other embodiments.

Returning to FIG. 4, at 414, one or more implants are used to form wells, such as base region 141 and access device body region 142. Well implants may be prone to generate metal contaminants. Accordingly, at 415 the same contact via mask used at 413A, or a variation of the contact mask, may be used. However, for purposes of clarity by way of example and not limitation, it shall be assumed that the same contact via mask is used. For example, for an array of thyristor-based memory cells having approximately 8 megabits with common anode and bitline contacts, there may be approximately 8 million gettering regions formed in the array. At 416, the implant used at 413B may be repeated to generate or regenerate defects in gettering regions 501 and 502. At 417, the masking layer formed at 415 and the sacrificial oxide may be removed. A buffered oxide etch ("BOE") may be used to remove the sacrificial oxide.

At 418, a gate oxide may be formed. The gate oxide may be thermally formed from exposed portions of an upper surface, and to a limited extent below such surface of such exposed portions, of silicon layer 140. The thermal cycling involved in forming a gate oxide may cause metal contaminants to be mobile for diffusing to gettering regions 501 and 502, as previously described. The metal contaminants attracted to defect regions are trapped.

For a dual gate thickness for forming thyristor-based memory cells, a dual gate oxide mask is formed at 419. After formation of such mask, an exposed portion of the gate oxide formed at 418 is removed using an oxide dip at 420. Basically, the gate oxide is removed from FET areas where access transistors of memory devices are located. Again, it has been assumed that an access device is present for memory devices; however, it should be understood as indicated above that a memory cell need not include an access device as part of such cell. BOE or oxide dip may be used for removing gate oxide in those FET areas.

At 421, a thermal oxide is grown for the FET gates. The mask formed at 419 may be used to mask this thermal oxidation.

At 422, polysilicon is deposited, doped, and patterned and a sealing oxidation is applied. At 423, extension implants, such as a lightly doped drain ("LDD") and a halo implant, may be used to form extension regions 131 and 132. At 424, spacer deposition is applied to form spacers alongside walls of the polysilicon gates. Additionally, at 424 a mask to form spacer 149 of FIG. 1B may be used, namely a spacer that extends in part above a portion of the polysilicon gate of the storage element of the thyristor-based memory cells. Alternatively, deposition for formation of a salicide block 149 may be performed at a later time in flow 400. As such formation of salicide block 149 is well-known, it is not described in unnecessary detail herein.

At 425, a spacer etch is used to remove unwanted spacer material deposited at 423. At 426, source/drain implants may be used to form regions 109, 121, 122, and 123. There may be masking involved for these implants, which is not described herein for purposes of clarity.

At 427, the mask used at 413A, as well as at 415, may be reapplied for forming openings for implantation to generate or regenerate defects in contaminant gettering regions 501 and 502. At 428, the implant previously used at 413B, as well as at 416, may be used to generate or regenerate defects in contaminant gettering regions 501 and 502.

At 429, a source/drain anneal may be done. The source/drain anneal thermally cycles the SOI wafer, including memory cell 500, making the metal contaminants mobile. The mobile metal contaminants are attracted to the defect sites in gettering regions 501 or 502. Once thermal cycling is complete, gettering regions 501 and 502 trap metal contaminants attracted thereto. Thereafter, the array of thyristor-based memory cells may be formed as is known, and such details are omitted for purposes of clarity.

Thus, it should be appreciated that within the process flow for forming an array of thyristor-based memory cells, there may be depositing a masking layer, patterning the masking layer, and performing a heavy ion implant to generate or regenerate defect sites in contaminant gettering regions 501 and 502, or at least one type thereof, whether at the bitline contact, wordline contact, cathode contact, or anode contact, or a combination thereof of a memory cell. Although multiple separate maskings and implantings were described, any one or any combination of two or more of these implantings may be used. For example, only one or two of such maskings and implantings may be implemented. Additionally, as well implants tend to be metal contaminant-prone, one or more maskings and implantings after 414 may be used to capture contaminants associated with well implants.

Figure 8:
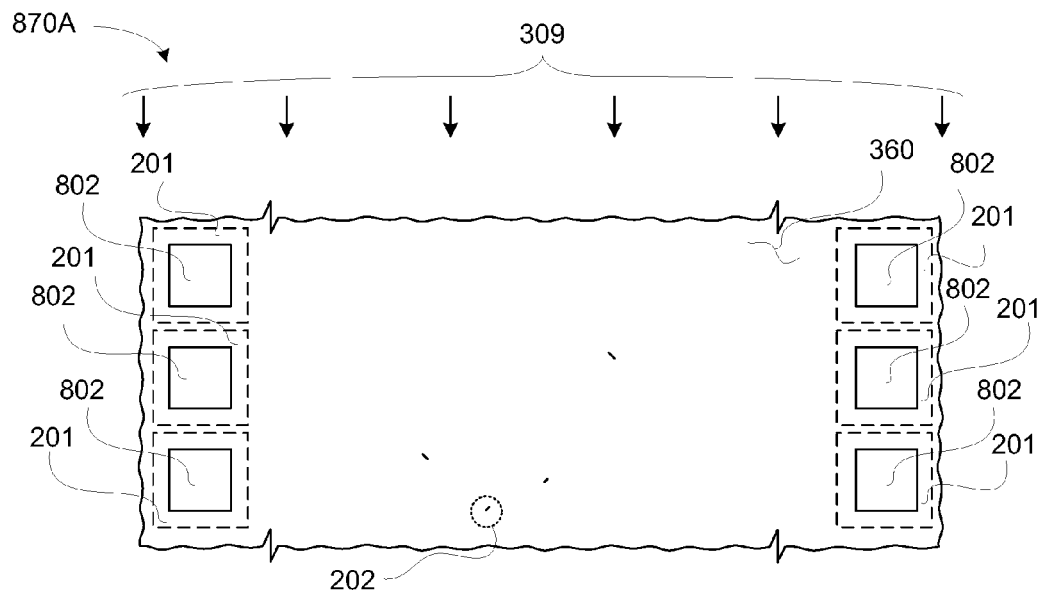
FIG. 8 is a top elevation view depicting an alternative exemplary embodiment of an SOI portion.

FIG. 8 is a top elevation view depicting an alternative exemplary embodiment of SOI portion 870A. In contrast to FIG. 3A, damage regions are formed within the perimeter of each of tiles 201, namely interior damage regions 802. In this embodiment, implant 309 may used to create damage regions 802 completely within an interior region what will later be defined as tiles 201. Some possible reasons for not having damage regions 802 extend to the edges of tiles 201 are for example to reduce the potential for contaminating an etcher or subsequent cleaning baths.

Mask 360 has openings defining upper surface areas of damage regions 802. Mask 360 in this embodiment covers perimeter and partially inward locations of tiles 201. Thus, contaminants 202 may be gettered toward damage regions 802 and may be trapped in defect sites thereof. Implant 309 may use the same heavy ions as described previously with reference to implant 209 of FIG. 2A.

If both etcher and cleaning bath contamination is not a problem, then arbitrary placement of damaged regions in the field may be used. This means that damage implant 309 may or may not coincide with tiles 201 or dummy stripes 161D; rather, damage regions from implant 309 may be located anywhere there is not an active device, such as anywhere in an STI region or STI regions. In an embodiment, damaged regions may be spaced away from active regions for when diffusion of contaminants, or point defects, is not complete, namely such contaminants do not all diffuse all the way to the damage regions.

As previously indicated, diffusion involves use of thermal energy. While not wishing to be bound by theory, it is believed that defects, such as those in damage regions, may atomically bind metallic contaminants, and the force driving contaminant movement to such defects is diffusion, with or without any ionic attraction of such metallic contaminants to such defects.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A semiconductor-on-insulator structure configured to attract contaminants, comprising:
   contaminant attractor regions formed using ion implantation into a semiconductor layer of the semiconductor-on-insulator structure;
   the semiconductor layer located above a buried insulator layer of the semiconductor-on-insulator structure;
   the contaminant attractor regions being spaced away from active regions of the semiconductor-on-insulator structure;
   tiles located on an upper surface of the buried insulator layer;
   the contaminant attractor regions formed adjacent to, in close proximity to, or in the tiles;
   the contaminant attractor regions for gettering at least a portion of the contaminants located in the active regions to the contaminant attractor regions;
   at least one dielectric layer laterally adjacent to the tiles and disposed on the upper surface of the buried insulator layer; and
   the at least one dielectric layer at least inhibiting lateral migration of contaminants to the active regions.

2. The semiconductor-on-insulator structure according to claim 1, wherein the contaminant attractor regions are capable of trapping point defects mobilized in the semiconductor layer by application of thermal energy.

3. The semiconductor-on-insulator structure according to claim 1, wherein the contaminant attractor regions include crystalline defects from the ion implantation.

4. The semiconductor-on-insulator structure according to claim 1, wherein the contaminant attractor regions include agglomerations of defects.

5. An integrated circuit formed on a semiconductor-on-insulator structure configured to attract contaminants, comprising:
   first contaminant attractor regions formed using a first ion implantation into a semiconductor layer of the semiconductor-on-insulator structure;
   the semiconductor layer located above a buried insulator layer of the semiconductor-on-insulator structure;
   an active region of the semiconductor layer of the semiconductor-on-insulator structure including a dummy stripe and an active stripe;
   the dummy stripe disposed at or proximate to an outer border of the active region;
   the first ion implantation being into the dummy stripe for formation of the first contaminant attractor regions therein;
   the first contaminant attractor regions for gettering at least a portion of the contaminants in the active region to the first contaminant attractor regions;
   at least one dielectric layer disposed on the upper surface of the buried insulator layer including extending laterally along sides of the dummy stripe; and
   the at least one dielectric layer at least inhibiting lateral migration of the contaminants from the first contaminant attractor regions of the dummy stripe to the active stripe when the semiconductor-on-insulator structure is exposed to a thermal cycle sufficient to mobilize the contaminants.

6. The integrated circuit according to claim 5, further comprising:
   tiles formed on an upper surface of the buried insulator layer of the semiconductor-on-insulator structure;
   the first ion implantation being into locations for the tiles and the location for the dummy stripe for forming the first contaminant attractor regions in both the tiles and the dummy stripe;
   the tiles being spaced away from the dummy stripe;
   the at least one dielectric layer laterally surrounding the tiles; and
   the at least one dielectric layer at least inhibiting lateral migration of the contaminants from the first contaminant attractor regions of the tiles to the active region when the semiconductor-on-insulator structure is exposed to the thermal cycle sufficient to mobilize the contaminants.

7. The integrated circuit according to claim 5, further comprising:
   second contaminant attractor regions formed using a second ion implantation into the semiconductor layer, the second ion implantation being done after the first ion implantation; and
   the second contaminant attractor regions being formed in contract regions located in the active stripe.

8. The integrated circuit according to claim 7, wherein the second contaminant attractor regions are formed in the contact regions of a thyristor-based memory cell array.

9. The integrated circuit according to claim 8, wherein the contact regions are at least one type of contact selected from a common anode contact and a common cathode contact.

10. The integrated circuit according to claim 8, wherein the contact regions are at least one type of contact selected from a common bitline contact and a common wordline contact.

* * * * *